(12) United States Patent
Chao et al.

(10) Patent No.: US 8,604,812 B2
(45) Date of Patent: Dec. 10, 2013

(54) VOLTAGE LIMITING TEST SYSTEM AND ASSISTANT TEST DEVICE

(75) Inventors: Hung Chao, Tu-Cheng (TW);
Jui-Hsiung Ho, Tu-Cheng (TW);
Cheng-Chung Huang, Tu-Cheng (TW);
Cheng-Hung Chiang, Tu-Cheng (TW);
Chung-Hsun Wu, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 325 days.

(21) Appl. No.: 13/048,021

(22) Filed: Mar. 15, 2011

(65) Prior Publication Data
US 2012/0187967 A1    Jul. 26, 2012

(30) Foreign Application Priority Data
Jan. 21, 2011    (TW) ................................. 100102396

(51) Int. Cl.
*G01R 31/00*    (2006.01)
(52) U.S. Cl.
USPC .................................................... 324/750.01

(58) Field of Classification Search
None
See application file for complete search history.

(56) References Cited

U.S. PATENT DOCUMENTS 6,198,642 B1 *    3/2001    Kociecki .......................... 363/37

\* cited by examiner

*Primary Examiner* — Jermele M Hollington
*Assistant Examiner* — Trung Nguyen
(74) *Attorney, Agent, or Firm* — Altis Law Group, Inc.

(57) ABSTRACT

A voltage limiting test system used to test limit voltage values of a memory includes a voltage limiting test device and an assistant test device connected to the voltage limiting test device. The voltage limiting test device includes a button to adjust a voltage of the memory. The assistant test device includes a first timer, and first and second relays. The first relay is used to receive a state signal of the motherboard, to determine whether the first timer is powered according to the state signal. The second relay is used to receive the pulse signal output by the first timer when the first timer is powered, to trigger the button to adjust the voltage of the memory per a reference time. When the motherboard stops working, the voltage value of the memory is a limit voltage value of the memory.

6 Claims, 2 Drawing Sheets

VOLTAGE LIMITING TEST SYSTEM AND ASSISTANT TEST DEVICE

BACKGROUND

1. Technical Field

The present disclosure relates to test systems, and particularly, to a voltage limiting test system having an assistant test device.

2. Description of Related Art

A voltage limiting test device is used to test a limiting voltage value of a memory of a motherboard. A voltage of the memory is changed by changing the resistance of a resistor in the voltage limiting test device. When the motherboard works, the voltage of the memory is adjusted, once the motherboard stops working, at that time, the voltage of the memory is the limiting voltage of the memory. However, during test, the voltage of the memory is changed by manually adjusting a button on the voltage limiting test device to change the resistance of the resistor, for the voltage of the memory to be adjusted once, the button needs to be triggered once, which is time-consuming and inefficient.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
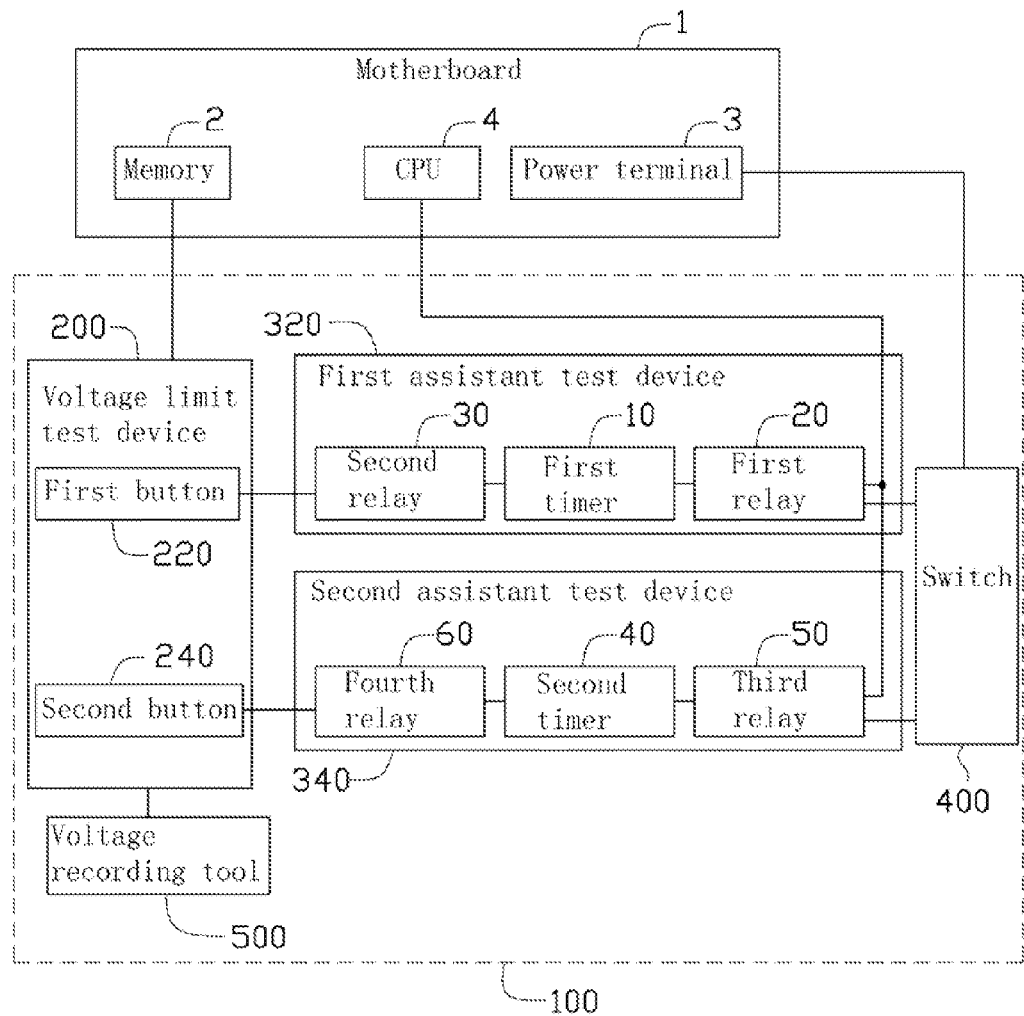
FIG. 1 is a block diagram of an exemplary embodiment of a voltage limiting test system, the voltage limiting test system includes assistant test devices.

Referring to FIG. 1, an exemplary embodiment of a voltage limiting test system 100 is used to test limiting voltage values of a memory 2 of a motherboard 1. The voltage limiting test system 100 includes a voltage limiting test device 200, a first assistant test device 320, a second assistant test device 340, a switch 400, and a voltage recording tool 500, such as a pen-shaped meter, connected to the voltage limiting test device 200. The first and second assistant test devices 320 and 340 are both connected to the voltage limiting test device 200. The switch 400 is connected to a power terminal 3 of the motherboard 1 and the first and second assistant test devices 320 and 340, to selectively connect the first or second assistant test device 320 or 340 to the power terminal 3 of the motherboard 1.

The voltage limiting test device 200 includes a first button 220 and a second button 240. When the voltage limiting test device 200 tests the memory 2, the first button 220 is triggered once, and a voltage value of the memory 2 increases a reference voltage value. When the second button 240 is triggered once, the voltage value of the memory 2 decreases the reference voltage value. The voltage recording tool 500 is used to record the voltage value of the memory 2 after triggering the first or second button 220 or 240. The first assistant test device 320 is connected to the first button 220. The second assistant test device 340 is connected to the second button 240.

Figure 2:
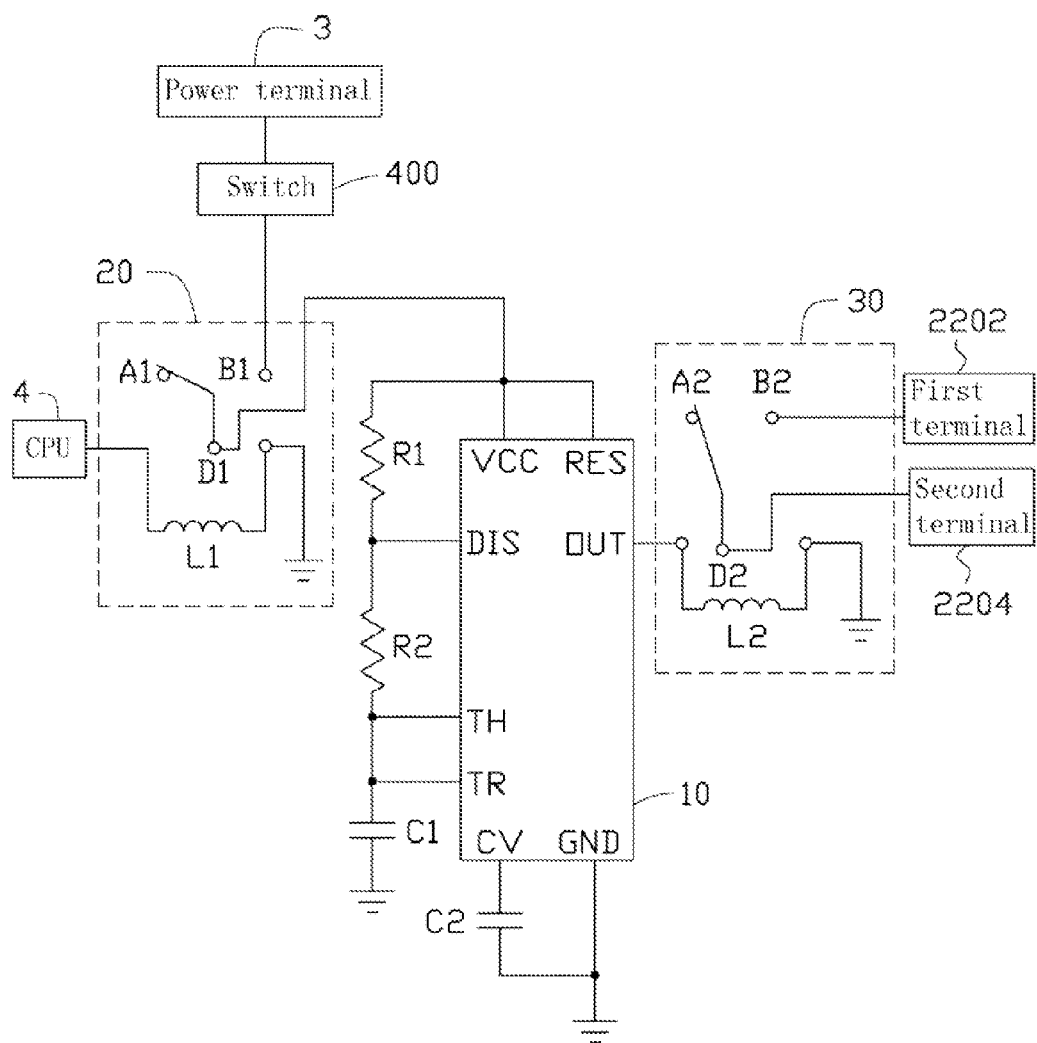
FIG. 2 is a circuit diagram of the assistant test device of FIG. 1.

Referring to FIGS. 1 and 2, the first assistant test device 320 includes a first relay 20, a second relay 30, and a first timer 10 connected between the first and second relays 20 and 30. The second assistant test device 340 includes a third relay 50, a fourth relay 60, and a second timer 40 connected between the third and fourth relays 50 and 60. The first and second timers 10 and 40 each include a ground pin GND, a triggering pin TR, an output pin OUT, a reset pin RES, a control voltage pin CV, a threshold pin TH, a discharging pin DIS, and a power pin VCC.

The second relay 30 of the first assistant test device 320 is connected to the first button 220, the fourth relay 60 of the second assistant test device 340 is connected to the second button 240. The first relay 20 and the third relay 50 are connected to the switch 400. The first assistant test device 320 is taken as an example to describe how the assistant test devices 320 and 340 works. The ground pin GND of the first timer 10 is grounded. A first resistor R1, a second resistor R2, and a first capacitor C1 are connected in series between the power pin VCC and ground. The trigger pin TR and the threshold pin TH are connected to a node between the first capacitor C1 and the second resistor R2. The control voltage pin CV is grounded through a second capacitor C2. The discharging pin DIS is connected to a node between the first and second resistors R1 and R2. The reset pin RES is connected to the power pin VCC. The power pin VCC is connected to a control terminal D1 of the first relay 20. A first terminal of an inductor L1 of the first relay 20 is connected to a central processing unit (CPU) 4 of the motherboard 1 to receive a state signal output by the CPU 4. The state signal denotes the CPU 4 can work normally, or cannot work normally. A second terminal of the inductor L1 of the first relay 20 is grounded. A first contact A1 of the first relay 20 is floating. A second contact B1 of the first relay 20 is connected to the power terminal 3 of the motherboard 1 through the switch 400. The output pin OUT of the first timer 10 is connected to a first terminal of an inductor L2 of the second relay 30. A second terminal of the inductor L2 is grounded. A first contact A2 of the second relay 30 is floating. A second contact B2 of the second relay 30 is connected to a first terminal 2202 of the first button 220. A control terminal D2 of the second relay 30 is connected to a second terminal 2204 of the first button 220. When there is no current passing through the first and second relays 20 and 30, the control terminal D1 keeps contacting the first contact A1 of the first relay 20. In addition, the control terminal D2 keeps contacting the first contact A2 of the second relay 30.

In the first assistant test device 320, the second contact B2 of the second relay 30 is connected to the first terminal 2202 of the first button 220 of the voltage limiting test device 200. The control terminal D2 of the second relay 30 is connected to the second terminal 2204 of the first button 220 of the voltage limiting test device 200. While in the second assistant test device 340, a second contact of the fourth relay 60 of the second assistant test device 340 is connected to a first terminal of the second button 240 of the voltage limiting test device 200. A control terminal of the fourth relay 60 of the second assistant test device 340 is connected to a second terminal of the second button 240 of the voltage limiting test device 200.

The switch 400 is connected between the second contact B1 of the first relay 20 of the first assistant test device 320 and the second contract of the third relay 50 of the second assistant test device 340. The switch 400 is also connected to the power terminal 3 of the motherboard 1 to turn-on the switch 400 to selectively connect the first or second assistant test device 320 or 340 to the power terminal 3 of the motherboard 1.

Test processes of upper and lower limit voltage values are the same, the test processes of the upper limit voltage value is taken as an example to describe.

When the switch 400 is connected to the first assistant test device 320 to connect the first assistant test device 320 to the power terminal 3, the second assistant test device 340 is not connected to the power terminal 3. The motherboard 1 works normally. The CPU 4 of the motherboard 1 outputs a high level signal to the first terminal of the inductor L1 of the first relay 20. The first relay 20 products a magnet field around the inductor L1. The control terminal D1 of the first relay 20 is disconnected from the first contact A1, and is connected to the second contact B1 of the first relay 20. The power terminal 3 supplies 5 volt (V) voltage to the power pin VCC of the first timer 10 of the first assistant test device 320 to power the first timer 10. The output pin OUT of the first timer 10 outputs a pulse signal to the first terminal of the inductor L2 of the second relay 30 of the first assistant test device 320, to trigger the second relay 30 once per reference time. The control terminal D2 of the second relay 30 is connected to the second contact B2 of the second relay 30 once per reference time. That is, the first button 220 of the voltage limiting test device 200 is triggered once per reference time, a resistance of a resistor of the voltage limiting test device 200 is changed once. The voltage value of the memory 2 of the motherboard 1 increases the reference voltage, when the voltage value of the memory 2 reaches a limit value, the motherboard 1 stops working. The CPU 4 of the motherboard 1 outputs a low level signal to the first terminal of the inductor L1 of the first relay 20 of the first assistant test device 320. The second contact B1 of the first relay 20 is disconnected from the control terminal D1 of the first relay 20. The first timer 10 of the first assistant test device 320 stops working. The second relay 30 of the first assistant test device 320 also stops working. The voltage recording tool 500 records the limit voltage. The limit voltage is the upper limit voltage of the memory 2. The voltage limiting test device 200 changing the resistance of the resistor by the corresponding first and second buttons 220 and 240 to further change the voltage value of the memory 2, falls within well-known technologies, and is therefore not described here.

When the lower limit voltage value needs to be tested, the switch 400 is connected to the second assistant test device 340 to connect the second assistant test device 340 to the power terminal 3. The test process of the lower limit voltage value is the same the test process of the upper limit voltage value.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A voltage limiting test system to test limit voltage values of a memory of a motherboard, the voltage limiting test system comprising:
a voltage limiting test device comprising a first button used to adjust a voltage of the memory; and
a first assistant test device connected to the voltage limiting test device, the first assistant test device comprising:
a first timer to output a pulse signal;
a first relay to receive a state signal of the motherboard, and to determine whether the first timer is powered according to the state signal; and
a second relay to receive the pulse signal output by the first timer when the first timer is powered, to trigger the first button to adjust the voltage of the memory per a reference time;
wherein when the motherboard stops working, the voltage value of the memory is a first limit voltage value of the memory.

2. The voltage limiting test system of claim 1, wherein a control terminal of the first relay is connected to a power pin of the first timer, a first terminal of an inductor of the first relay is connected to a central processing unit (CPU) of the motherboard to receive the state signal, a second terminal of the inductor of the first relay is grounded, a first contact of the first relay is floating, a second contact of the first relay is connected to a power terminal of the motherboard to power the first timer, the control terminal of the first relay is also connected to the first contact of the first relay in response to there being no current flowing through the inductor of the first relay, an output pin of the first timer is connected to a first terminal of an inductor of the second relay, a second terminal of the inductor of the second relay is grounded, a first contact of the second relay is floating, a second contact of the second relay is connected to a first terminal of the first button, a control terminal of the second relay is connected to a second terminal of the button, the control terminal of the second relay is also connected to the first contact of the second relay in response to there being no current flowing through the inductor of the second relay, wherein when the first terminal of the inductor of the first relay receives the state signal which denotes the motherboard works normally, the control terminal of the first relay is disconnected from the first contact of the first relay and connected to the second contact of the first relay to supply a voltage from the power terminal of the motherboard to the first timer, the first timer is powered, and outputs the pulse signal to control the second relay to trigger the first button per the reference time to adjust the voltage of the memory.

3. The voltage limiting test system of claim 2, further comprising a second assistant test device and a switch connected to the first and second assistant test devices, wherein the switch is connected to a power terminal of the motherboard to selectively connect the first or second assistant test device to the power terminal of the motherboard, the voltage limiting test device further comprises a second button, when the first button is triggered once, the voltage of the memory increases a reference voltage, when the second button is triggered once, the voltage of the memory decreases the reference voltage, the first limit voltage value is an upper limit voltage value of the memory, the second assistant test device comprises a second timer, a third relay, and a fourth relay, when the switch connects the second assistant test device to the power terminal of the motherboard, the first assistant test device is disconnected from the power terminal of the motherboard, the third relay receives the state signal from the motherboard, and determines whether the second timer is powered according to the state signal, the fourth relay receives a pulse signal output by the second timer to trigger the second button per the reference time to decrease the voltage of the memory when the second timer is powered, when the motherboard stops working, the voltage value of the memory is a lower limit voltage value of the memory.

4. The voltage limiting test system of claim 1, further comprising a voltage recording tool connected to the voltage limiting test device to record voltage values of the memory after the voltage of the memory is adjusted every time.

5. An assistant test device to connect to a button of a voltage limiting test device to assist the voltage limiting test device to test limit voltages of a memory of a motherboard, the assistant test device comprising:
   a first timer to output a pulse signal;
   a first relay to receive a state signal of the motherboard, and to determine whether the first timer is powered according to the state signal; and
   a second relay to receive the pulse signal output by the first timer when the first timer is powered to trigger the button to adjust the voltage of the memory per a reference time;
   wherein when the motherboard stops working, the voltage value of the memory is a limit voltage value of the memory.

6. The assistant test device of claim 5, wherein a control terminal of the first relay is connected to a power pin of the first timer, a first terminal of an inductor of the first relay is connected to a central processing unit (CPU) of the motherboard to receive the state signal, a second terminal of the inductor of the first relay is grounded, a first contact of the first relay is floating, a second contact of the first relay is connected to a power terminal of the motherboard to power the first timer, the control terminal of the first relay is also connected to the first contact of the first relay in response to there being no current flowing through the inductor of the first relay, an output pin of the first timer is connected to a first terminal of an inductor of the second relay, a second terminal of the inductor of the second relay is grounded, a first contact of the second relay is floating, a second contact of the second relay is connected to a first terminal of the first button, a control terminal of the second relay is connected to a second terminal of the button, the control terminal of the second relay is connected to the first contact of the second relay in response to there being no current flowing through the inductor of the second relay, when the first terminal of the inductor of the first relay receives the state signal which denotes the motherboard works normally, the first relay products a magnet field around the inductor, the control terminal of the first relay is disconnected from the first contact of the first relay and connected to the second contact of the first relay to supply a voltage from the power terminal of the motherboard to the first timer, the first timer is powered, and outputs the pulse signal to control the second relay to trigger the button per the reference time to adjust the voltage of the memory.

\* \* \* \* \*